(12) United States Patent
Lee et al.

(10) Patent No.: US 7,807,580 B2
(45) Date of Patent: Oct. 5, 2010

(54) TRIPLE POLY-SI REPLACEMENT SCHEME FOR MEMORY DEVICES

(75) Inventors: Chungho Lee, Sunnyvale, CA (US); Huaqiang Wu, Mountain View, CA (US); Wai Lo, Palo Alto, CA (US); Hiroyuki Kinoshita, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 784 days.

(21) Appl. No.: 11/742,003

(22) Filed: Apr. 30, 2007

(65) Prior Publication Data
US 2008/0268650 A1 Oct. 30, 2008

(51) Int. Cl.
*H01L 21/302* (2006.01)
(52) U.S. Cl. .................. 438/706; 438/689; 438/690; 438/702; 216/37; 216/89
(58) Field of Classification Search ............ 438/689, 438/690, 702, 706; 216/37, 67, 89
See application file for complete search history.

(56) References Cited

U.S. PATENT DOCUMENTS

| | | | | |
|---|---|---|---|---|
| 4,774,202 A | * | 9/1988 | Pan et al. ................ | 438/594 |
| 6,204,159 B1 | * | 3/2001 | Chang et al. ............. | 438/594 |
| 6,943,373 B2 | * | 9/2005 | Takaura et al. ........... | 257/67 |
| 7,151,028 B1 | * | 12/2006 | Fang et al. ............... | 438/257 |
| 2007/0243680 A1 | * | 10/2007 | Harari et al. ............. | 438/257 |

* cited by examiner

*Primary Examiner*—Lan Vinh
*Assistant Examiner*—Maki A Angadi
(74) *Attorney, Agent, or Firm*—Turocy & Watson, LLP

(57) ABSTRACT

A method of replacing a top oxide around a storage element of a memory device is provided. The method can involve removing a core first poly and core first top oxide in a core region while not removing a periphery first poly in a periphery region on a semiconductor substrate; forming a second top oxide around a storage element in the core region and on the periphery first poly in the periphery region; forming a second poly over the semiconductor substrate in both the core and periphery regions; removing the second poly and second top oxide in the periphery region; and forming a third poly on the semiconductor substrate in both the core and periphery regions.

20 Claims, 5 Drawing Sheets

TRIPLE POLY-SI REPLACEMENT SCHEME FOR MEMORY DEVICES

TECHNICAL FIELD

The subject invention generally relates to methods of replacing/reforming a top oxide of a memory device and/or improving quality of a top oxide of a memory device.

BACKGROUND

In the semiconductor industry, there is a continuing trend toward higher device densities. To achieve these high densities there have been, and continue to be, efforts toward scaling down device dimensions (e.g., at sub-micron levels) on semiconductor wafers and to increase the number of layers of such devices on a chip. In order to accomplish such high device packing densities, smaller and smaller features sizes are required. This may include the width and spacing of interconnecting lines, spacing and diameter of contact holes, and the surface geometry, such as corners and edges, of various features.

The process of manufacturing semiconductor structures or integrated circuits (commonly called ICs or chips) typically consists of more than a hundred steps, during which hundreds of copies of an integrated circuit may be formed on a single wafer. Generally, the process involves creating several patterned layers on and into the substrate that ultimately forms the complete integrated circuit. This layering process creates electrically active regions in and on the semiconductor wafer surface.

The requirement of small features with close spacing between adjacent features requires sophisticated manufacturing techniques including formation of a top oxide on a storage element. Fabricating a semiconductor structure using such sophisticated techniques may involve a series of steps including cleaning, thermal oxidation or deposition, masking, developing, etching, baking and doping.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

One aspect of the subject invention provides a method of replacing a top oxide around a storage element of a memory device. The methods involve removing a core first poly and core first top oxide in a core region while not removing a periphery first poly in a periphery region on a semiconductor substrate; forming a second top oxide around a storage element in the core region and on the periphery first poly in the periphery region; forming a second poly over the semiconductor substrate in both the core and periphery regions; removing the second poly and second top oxide in the periphery region; and forming a third poly on the semiconductor substrate in both the core and periphery regions. By replacing/reforming the top oxide around the storage element, the quality of the reformed top oxide can be improved.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
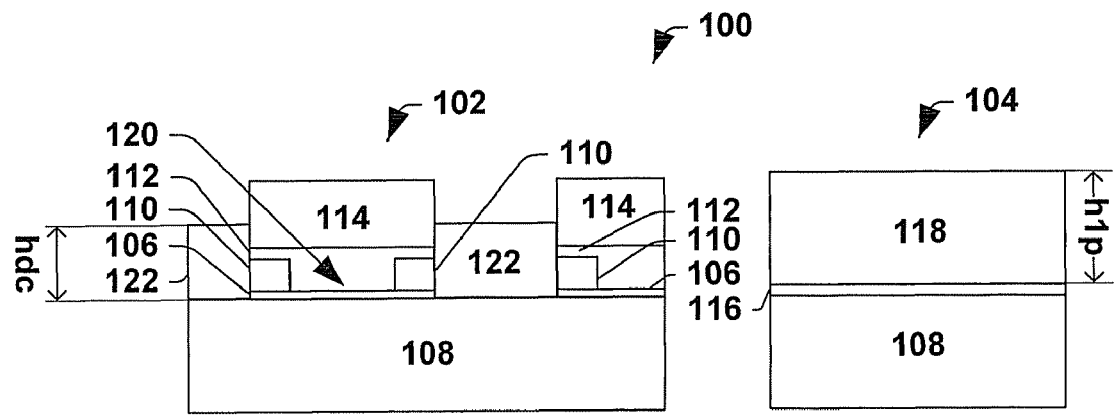
FIG. 1 illustrates a cross sectional view of an intermediate state of an exemplary memory device fabrication process in accordance with an aspect of the subject invention.

Memory devices may contain a core region and periphery region. The core region of a memory device is a high-density region that typically includes one or more M×N array cores of individually addressable, substantially identical memory cells. The periphery region of a memory device is a low-density region that typically includes input/output (I/O) circuitry and circuitry for selectively addressing the individual cells. The selective addressing circuitry typically includes one or more x-decoders and y-decoders, cooperating with the I/O circuitry for connecting the source, gate, and drain region of selected addressed cells to predetermined voltages or impedances to effect designated operations on the cell, e.g., programming, reading and erasing, and deriving necessary voltages to effect such operations.

In the core region, the memory cells may contain a gate oxide on a semiconductor substrate, a storage element on the gate oxide, a top oxide on the storage element, and a first poly on the top oxide. In the periphery region, the memory transistors may contain a gate oxide on a semiconductor substrate and a first poly on the gate oxide. The top oxide can function to isolate the transfer of charge between the storage element and the first poly, permitting scaling of the storage element to realize low programming voltages. However, the top oxide may suffer from certain drawbacks as a memory device is scaled down. The lower the quality of the top oxide, the more charge that may leak through such a layer. For this reason, the quality of the top oxide is an important feature in a memory device.

To improve the quality of the top oxide on the storage element, the first poly in the core region can be removed and another top oxide can be reformed in its place. However, if the first poly in the periphery region is exposed to the core first poly removing process and core top oxide reforming process, this may lead to the following problems: 1) if the periphery first poly is removed at the same time that the core first poly is removed, the periphery gate oxide is exposed to the core first poly removing process, 2) if the periphery first poly is not removed at the same time that the core first poly is removed, there are differential poly heights, and hence a substantial difference in topography between the core and periphery regions, and 3) an oxidation of periphery first poly during the core top oxide reforming process may result in process complications during subsequent fabrication processes of the memory device.

The subject invention provides methods of replacing/reforming a top oxide around a storage element of a memory device and/or improving quality of a core top oxide of a memory device. In the methods, by not removing a periphery first poly at the same time that a core first poly is removed, the periphery gate oxide is not exposed to the core first poly removing process. Moreover, by masking a periphery first poly while removing a core first poly and/or a core first top oxide and/or while forming a second top oxide around a storage element, the periphery first poly is not substantially damaged or removed by removing the core first poly and/or the core first top oxide and/or by forming the core second top oxide. In addition, by forming a second poly and a third poly in a core region and forming a first poly and a third poly in a periphery region, the resultant memory device does not have a substantial difference in topography between the core and periphery regions.

The methods can be performed on the memory devices before finally defining poly word lines by lithography and etching techniques. In one embodiment, the method involves removing a core first poly in a core region while not removing a periphery first poly in a periphery region on a semiconductor substrate; removing a core first top oxide; forming a second top oxide around a storage element in the core region and on the periphery first poly in the periphery region; forming a second poly over the semiconductor substrate in both the core and periphery regions; removing the second poly in the periphery region; removing the second top oxide on the periphery first poly in the periphery region; and forming a third poly on the semiconductor substrate in both the core and periphery regions.

One advantage of the subject invention is improving quality of a core top oxide of a memory device by replacing/reforming a core top oxide. In one embodiment, by replacing/reforming the top oxide around a storage element in the core region, the quality of the reformed top oxide can be improved. For example, a high F-N field of the reformed top oxide can be achieved. Charge leakage paths can be reduced and/or minimized at the interface between the top oxide and the storage element. In another embodiment, by replacing/reforming the top oxide around the storage element in the core region, any suitable height of the reformed top oxide can be achieved. In yet another embodiment, by not removing a periphery first poly when removing a core first poly, a periphery gate oxide is not exposed to the core first poly removing process, and therefore the quality of the periphery gate oxide cannot be impaired. In still yet another embodiment, by selecting any suitable height of the first, second, and third polys, the resultant memory device does not have a substantial difference in topography between the core and periphery regions. In another embodiment, by removing the second top oxide on the first poly in the periphery region, the periphery region substantially does not have any oxide between the first and third polys. As a result, a subsequent memory device fabrication process can be simplified. The subject invention therefore effectively addresses the concerns raised by the trend towards the miniaturization of memory devices.

The invention is now described with reference to the drawings, wherein like reference numerals are used to refer to like elements throughout. In the following description, for purposes of explanation, numerous specific details are set forth in order to provide a thorough understanding of the subject invention. It may be evident, however, that the invention can be practiced without these specific details. In other instances, well-known structures and devices are shown in block diagram form in order to facilitate describing the invention. Referring to FIGS. 1 to 7, one of many possible exemplary embodiments of improving quality of a core top oxide of a memory device is illustrated.

FIG. 1 illustrates a cross sectional view of an intermediate state of an exemplary top oxide reformation process. The memory device 100 contains a core region 102 and periphery region 104. In the core region 102, the memory device 100 can contain a gate oxide 106 on a semiconductor substrate 108, a storage element 110 on the gate oxide 106, a first top oxide 112 around the storage element 110, and a first poly 114 on the first top oxide 112. In the periphery region 104, the memory device 100 can contain a gate oxide 116 on a semiconductor substrate 108 and a first poly 118 on the gate oxide 116.

The semiconductor substrate 108 may contain any suitable semiconductor material on which an electric device such as a transistor can be formed. For example, the semiconductor substrate 108 contains a silicon substrate.

The gate oxide 106, 116 in the core region 102 and periphery region 104 may contain any suitable oxide material. Examples of oxide materials include silicon oxide. When the memory device 100 is a non-volatile memory device, the core gate oxide 106 may be referred to as a tunnel gate oxide and the periphery gate oxide 116 may be referred to as a thin gate dielectric layer. The gate oxide 106, 116 can be formed on the semiconductor substrate 108 by any suitable technique. For example, the gate oxide 106, 116 can be formed on the semiconductor substrate 108 by thermal oxidation, chemical vapor deposition (CVD), and the like.

The storage element 110 may contain any suitable charge storage material. Examples of charge storage materials include nitrides, oxides, or silicates. In one embodiment, the charge storage material contains silicon nitride and/or silicon oxynitride. The silicon nitride storage element 110 may be an integrated part of an oxide-nitride-oxide (ONO) tri-layer which is fabricated by forming a first silicon oxide layer, forming a silicon nitride layer on the first silicon oxide layer, and forming a second silicon oxide layer on the silicon nitride layer. In another example, the charge storage material contains oxides or silicates containing Al, Ta, Hf, La, Zr, Ti, Nb, Cr, V, Y, Ce and/or Pr. The storage element 110 can be formed on the gate oxide 106 by any suitable technique. For example, the storage element 110 can be formed by CVD, lithography, and etching techniques.

The core first top oxide 112 may contain any suitable oxide material. Examples of oxide materials include silicon oxide. The core first top oxide 112 is formed around the surface of the storage element 110. In this example, the space 120 between the storage elements 110 on the semiconductor substrate 108 is filled with the top oxide material. The oxide material at the space 120 can be formed at any suitable time. For example, the oxide material at the space 120 can be formed before the storage element 110 is defined/formed. The oxide material at the space 120 can be formed at the same time that the storage element 110 and/or the core first top oxide 112 are defined/formed. The oxide material at the space 120 can be formed after the storage element 110 is defined/formed. In another embodiment, the space 120 between the storage elements 110 on the semiconductor substrate 108 is not filled with the top oxide material, and the core first top oxide 112 is formed around only the surface of the storage element 110 (not shown). The core first top oxide 112 can be formed by any suitable technique. For example, the core first top oxide 112 can be formed by thermal oxidation, CVD, and the like.

The first poly 114, 118 in the core region 102 and periphery region 104 typically contains polysilicon. The first poly 114, 118 can be formed on the semiconductor substrate 108 by, for example, CVD. The height of the first poly 114, 118 may vary and is not critical to the subject invention. The first poly 114, 118 can have any suitable height independently. The height may depend on, for example, the desired implementations and/or the memory device 100 being fabricated. In one embodiment, the height of the first poly 118 in the periphery region 104 (h1$p$) is about 500 Angstroms or more and 3,000 Angstroms or less. In another embodiment, the height of the first poly 118 in the periphery region 104 (h1$p$) is about 600 Angstroms or more and 2,000 Angstroms or less. In yet another embodiment, the height of the first poly 118 in the periphery region 104 (h1$p$) is about 700 Angstroms or more and 1,500 Angstroms or less. In still yet another embodiment, the height of the first poly 118 in the periphery region 104 (h1$p$) is about 1,000 Angstroms.

The memory device 100 may further contain a dielectric 122. The storage elements 110 are typically separated with the dielectric 122 on the semiconductor substrate 108. General examples of dielectrics include silicon based dielectric materials, oxide dielectric materials, silicates, low k materials, and the like. Examples of silicon based dielectric materials include silicon dioxide, silicon oxynitride, high density plasma (HDP) oxide, and the like. Examples of silicates include fluorine doped silicon glass (FSG), tetraethylorthosilicate (TEOS), borophosphotetraethylorthosilicate (BP-TEOS), phosphosilicate glass (PSG), borophosphosilicate glass (BPSG), other suitable spin-on glasses, and the like.

The dielectric 122 can be formed by any suitable technique including CVD such as plasma enhanced CVD. The height of the dielectric 122 may vary and is not critical to the subject invention. The dielectric 122 can have any suitable height that depends on, for example, the desired implementations and/or the memory device 100 being fabricated. In one embodiment, the height of the dielectric 122 in the core region 102 (hdc) is about 100 Angstroms or more and 2,000 Angstroms or less. In another embodiment, the height of the dielectric 122 in the core region 102 (hdc) is about 200 Angstroms or more and 1,000 Angstroms or less. In yet another embodiment, the height of the dielectric 122 in the core region 102 (hdc) is about 300 Angstroms or more and 800 Angstroms or less. In still yet another embodiment, the height of the dielectric 122 in the core region 102 (hdc) is about 500 Angstroms.

Figure 2:
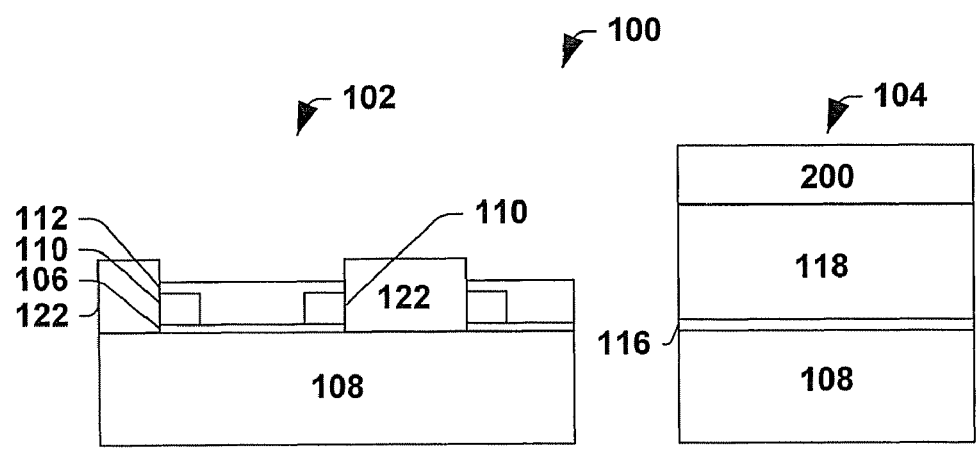
FIG. 2 illustrates removing a first poly in a core region of a memory device in accordance with an aspect of the subject invention.

FIG. 2 illustrates removing the core first poly 114 while not removing the periphery first poly 118 on the semiconductor substrate 108. The core first poly 114 is removed, but the periphery first poly 118 is not substantially removed or damaged by protecting the periphery first poly 118 with a first mask 200 formed on the periphery first poly 118.

The core first poly 114 can be removed by, for example, etching. For example, the core first poly 114 can be removed by contacting the core first poly 114 with any suitable poly etchant that does not substantially affect or damage the integrity of other components/layers in the memory device 100. The poly etching can be dry etching or wet etching. Examples of dry etching include plasma etching, reactive ion etching (RIE), and the like. For example, the plasma etching is performed with chlorinating agents such as $Cl_2$ or a combination of $BCl_3$ and a halogenated hydrocarbon. The poly etch can also be performed with combinations of, for example, $SiCl_4$, $BCl_3$, HBr, $Br_2$, $SF_6$, and $CF_4$. Additives such as $N_2$, $O_2$, Ar, He, or any other noble gas can be included. Other examples of the poly etchants include tetraalkylammonium hydroxides (e.g., tetramethylammonium hydroxide (TMAH)) and alkali metal hydroxides (e.g., a potassium hydroxide (KOH) and cerium hydroxide (CeOH)).

The periphery first poly 118 is not removed since the periphery first poly 118 is protected by the first mask 200. The first mask 200 can be formed by, for example, depositing a resist on the semiconductor substrate 108, exposing the resist to a pattern of radiation, and developing the resist into the pattern to protect the periphery first poly 118.

Figure 3:
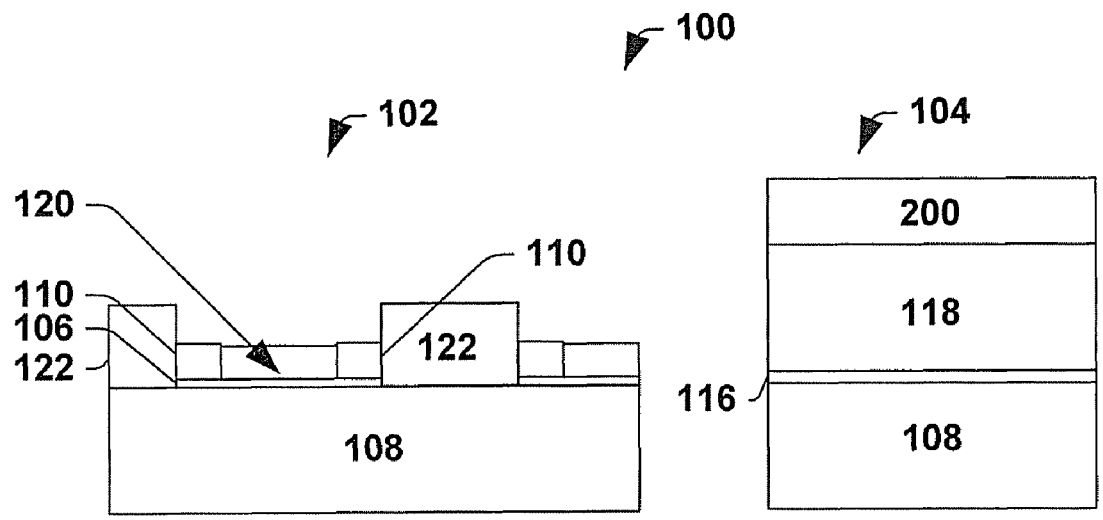
FIG. 3 illustrates removing a core first top oxide in accordance with an aspect of the subject invention.

FIG. 3 illustrates removing the first top oxide 112 around the storage element 110. The first top oxide 112 can be removed by, for example, etching. The first top oxide 112 can be removed by contacting the first top oxide 112 with any suitable oxide etchant that does not substantially affect or damage the integrity of other components/layers in the memory device 100. The oxide etching can be dry etching or wet etching. Examples of oxide etchants include halogen acids such as hydrofluoric acid. In one embodiment, the oxide etchant is a hydrofluoric acid solution such as a buffered hydrofluoric acid (BHF: e.g., hydrofluoric acid-ammonium fluoride buffered solution). In another embodiment, the oxide etchant is a vapor of hydrofluoric acid. In yet another embodiment, the first top oxide 112 is removed by an oxide etchant gas, such as $SiCl_4/Cl_2$, $BCl_3/Cl_2$, $CCl_4$, mixtures of fluorinated or chlorinated gases, mixtures of Freon-based gases, and the like.

When the space 120 between the storage elements 110 on the semiconductor substrate 108 is filled with the top oxide material, the oxide material at the space 120 between the storage elements 110 can be partially removed by the first top oxide etching process. Any suitable amount of the oxide material at the space 120 between the storage elements 110 can be removed. In one embodiment, the oxide material above the upper surface of the storage element 110 is removed, and the oxide material below the upper surface of the storage element 110 is remained. In another embodiment, substantially all of the oxide material above the upper surface of the storage element 110 and between the storage elements 110 is removed (not shown). In yet another embodiment, the oxide material around only the storage element 110 is removed (not shown).

Figure 4:
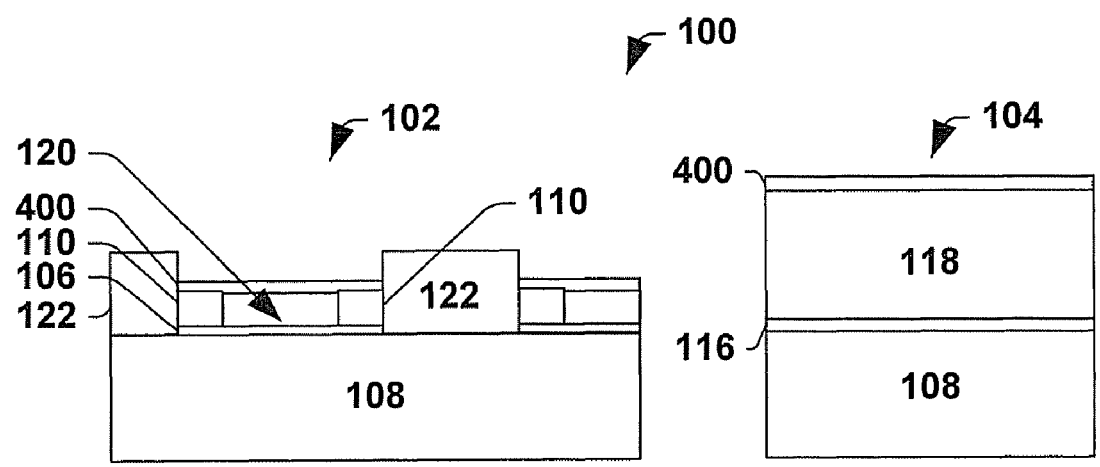
FIG. 4 illustrates forming a second top oxide around a storage element in a core region and on a first poly in a periphery region in accordance with an aspect of the subject invention.

FIG. 4 illustrates forming a core second top oxide 400 over the semiconductor substrate 108 including the storage element 110 and periphery first poly 118 after removing the first mask 200. By reforming a core top oxide, a high quality second top oxide 400 can be provided around the storage element 110. The second top oxide 400 can be formed by any suitable technique. For example, the second top oxide 400 is formed by thermal oxidation techniques, deposition techniques such as CVD or spin-on techniques, and the like. When the oxide material at the space 120 between the storage elements 110 is partially removed in the previous process in connection with FIG. 3, an oxide material can be reformed at the space 120 between the storage elements 110 at the same time that the second top oxide 400 is formed around the storage element 110.

Any suitable oxide material can be employed for the second top oxide 400. Examples of oxide materials include a high temperature oxide, low temperature oxide, and the like.

In one embodiment, the second top oxide 400 is grown around the storage element 110 in plasma at low temperatures, e.g., plasma-grown oxide. For example, the second top oxide 400 contains plasma-grown oxide that is grown at a temperature of about 250 degrees Celsius or more and about 600 degrees Celsius or less. In another embodiment, the second top oxide 400 is formed around the storage element 110 using a slot plane antenna (SPA) process. In the SPA process, the plasma-grown oxide is grown in a chamber that includes a microwave slot antenna, which is used to generate the plasma. The microwave slot antenna can be configured to provide a plasma distribution that results in a plasma-grown oxide having increased uniformity, conformity, and quality compared to conventional plasma oxide. In the SPA process, the species used to grow the oxide can contain one or more of oxygen, argon, or hydrogen, for example. In yet another embodiment, the second top oxide 400 is a steam oxide that is grown around the storage elements 110 by heating the storage elements 110 in the presence of steam.

Figure 5:
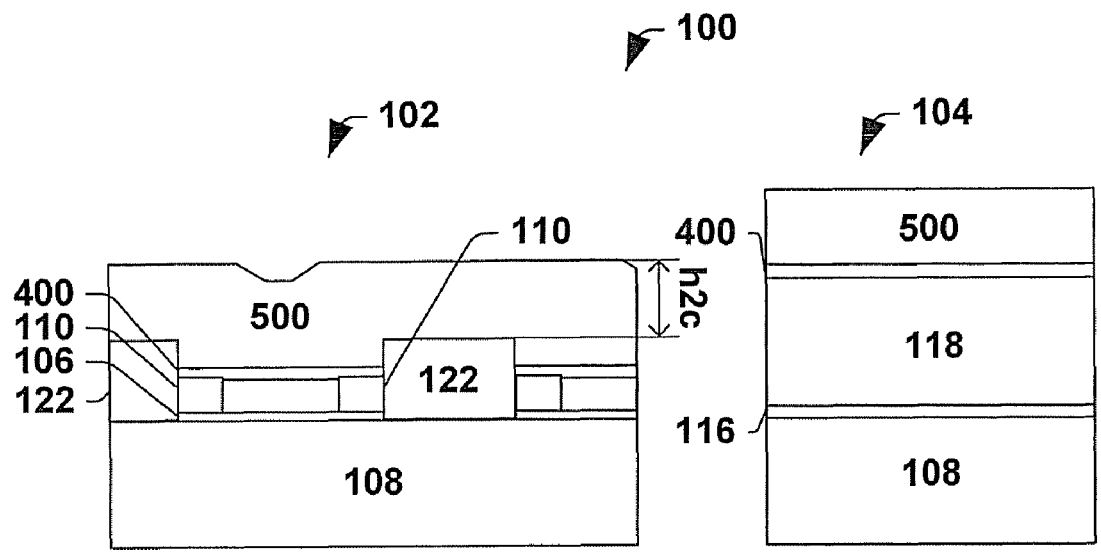
FIG. 5 illustrates forming a second poly in a core and periphery regions in accordance with an aspect of the subject invention.

FIG. 5 illustrates forming a second poly 500 over the semiconductor substrate 108 in both core region 102 and periphery region 104. In the core region 102, the second poly 500 can be formed over the second top oxide 400. In the periphery region 104, the second poly 500 can be formed over the second top oxide 400. The second poly 500 typically contains polysilicon. The second poly 500 can be formed on the semiconductor substrate 108 by, for example, CVD.

The height of the second poly 500 may vary and is not critical to the subject invention. The second poly 500 can have any suitable height that depends on, for example, the desired implementations and/or the memory device 100 being fabricated. In one embodiment, the height of the second poly 500 on the dielectric 122 in the core region 102 (h2c) is about 200 Angstroms or more and 2,000 Angstroms or less. In another embodiment, the height of the second poly 500 on the dielectric 122 in the core region 102 (h2c) is about 300 Angstroms or more and 1,500 Angstroms or less. In yet another embodiment, the height of the second poly 500 on the dielectric 122 in the core region 102 (h2c) is about 400 Angstroms or more and 1,000 Angstroms or less. In still yet another embodiment, the height of the second poly 500 on the dielectric 122 in the core region 102 (h2c) is about 600 Angstroms.

Figure 6:
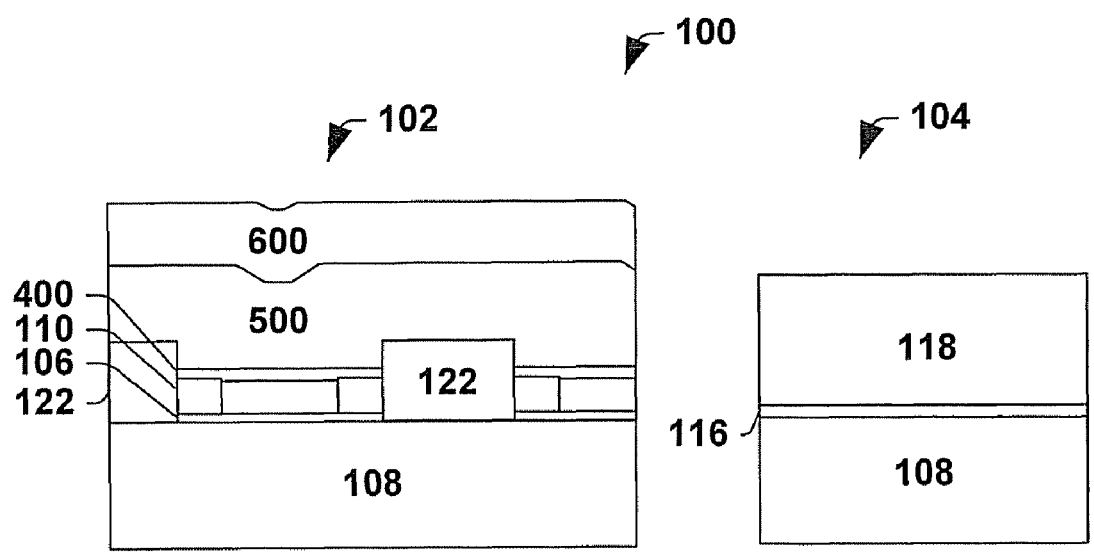
FIG. 6 illustrates removing a second poly and second top oxide in a periphery region in accordance with an aspect of the subject invention.

FIG. 6 illustrates forming a second mask 600 over the core region 102 and removing the second poly 500 and second top oxide 400 in the periphery region 104. The second poly 500 and the second top oxide 400 in the periphery region 104 are removed while the second poly 500 in the core region 102 is not removed since the second poly 500 in the core region 102 is protected by the second mask 600. The second mask 600 can be formed on the core region 102 by, for example, depositing a resist on the semiconductor substrate 108, exposing the resist to a pattern of radiation, and developing the resist into the pattern to cover the core second poly 500.

The second poly 500 in the periphery region 104 can be removed by any suitable technique, for example, etching. For example, the periphery second poly 500 is removed in the same manner described in connection with the removal of the core first poly 114 in FIG. 2. The periphery second top oxide 400 can be removed by any suitable technique, for example, etching. For example, the periphery second top oxide 400 is removed in the same manner described in connection with the removal of the first top oxide 112 in FIG. 3.

Figure 7:
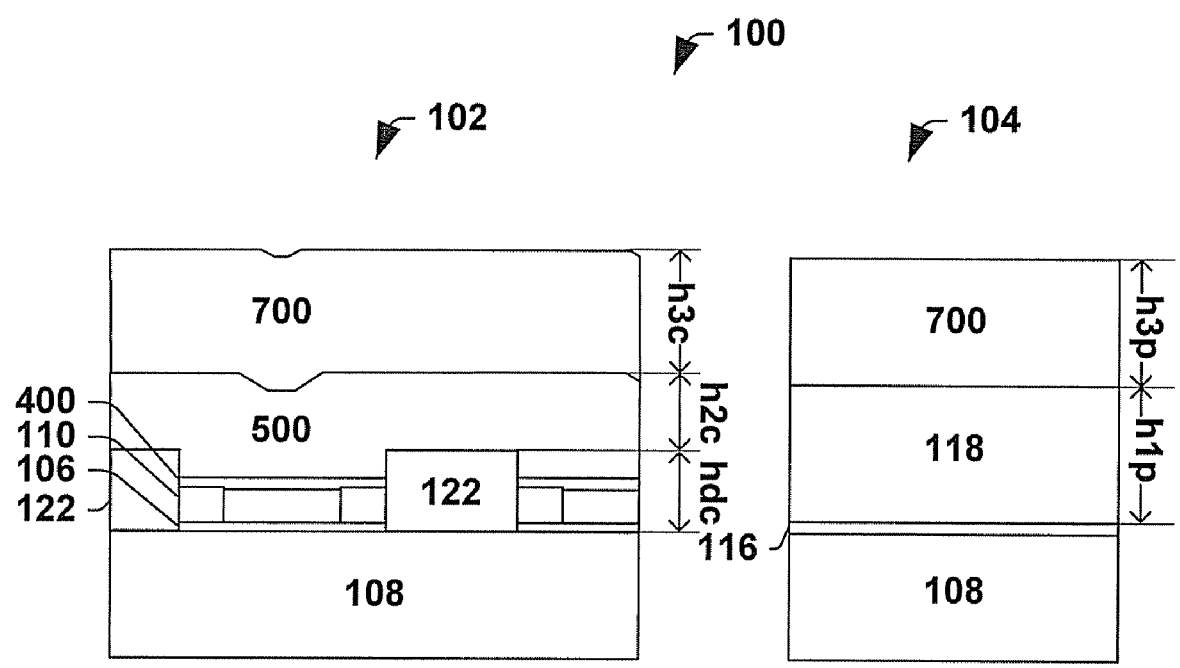
FIG. 7 illustrates forming a third poly on a semiconductor substrate in accordance with an aspect of the subject invention.

FIG. 7 illustrates forming a third poly 700 over the semiconductor substrate 108 in both core region 102 and periphery region 104 after removing the second mask 600. In the core region 102, the third poly 700 can be formed over the second poly 500. In the periphery region 104, the third poly 700 can be formed over the first poly 118. The third poly 700 typically contains polysilicon. The third poly 700 can be formed on the semiconductor substrate 108 by, for example, CVD.

The height of the third poly 700 may vary and is not critical to the subject invention. The third poly 700 in the core region 102 and periphery region 104 can have any suitable height independently. The height may depend on, for example, the desired implementations and/or the memory device 100 being fabricated. In one embodiment, the height of the third poly 700 in the core region 102 (h3c) and the height of the third poly 700 in the periphery region 104 (h3p) are about 200 Angstroms or more and 3,000 Angstroms or less. In another embodiment, the height of the third poly 700 in the core region 102 (h3c) and the height of the third poly 700 in the periphery region 104 (h3p) are about 400 Angstroms or more and 2,000 Angstroms or less. In yet another embodiment, the height of the third poly 700 in the core region 102 (h3c) and the height of the third poly 700 in the periphery region 104 (h3p) are about 600 Angstroms or more and 1,500 Angstroms or less. In still yet another embodiment, the height of the third poly 700 in the core region 102 (h3c) and the height of the third poly 700 in the periphery region 104 (h3p) are about 1,000 Angstroms.

The upper surface of the third poly 700 in the core region 102 can be substantially coplanar with the upper surface of the third poly 700 in the periphery region 104. As a result, topography height differences between the core and periphery regions 102, 104 can be reduced and/or minimized, and therefore subsequent memory device fabrication processes can be simplified. In one embodiment, the upper surface of the third poly 700 on the dielectric 122 in the core region 102 is substantially coplanar with the upper surface of the third poly 700 in the periphery region 104. For example, the sum of the heights of dielectric 122 (hdc), second poly 500 (h2c), and third poly 700 (h3c) in the core region 102 is substantially equal to the sum of the heights of the first poly 118 (h1p) and third poly 700 (h3p) in the periphery region 104. In another embodiment, the upper surface of the third poly 700 on the storage elements 110 in the core region 102 is substantially coplanar with the upper surface of the third poly 700 in the periphery region 104.

Figure 8:
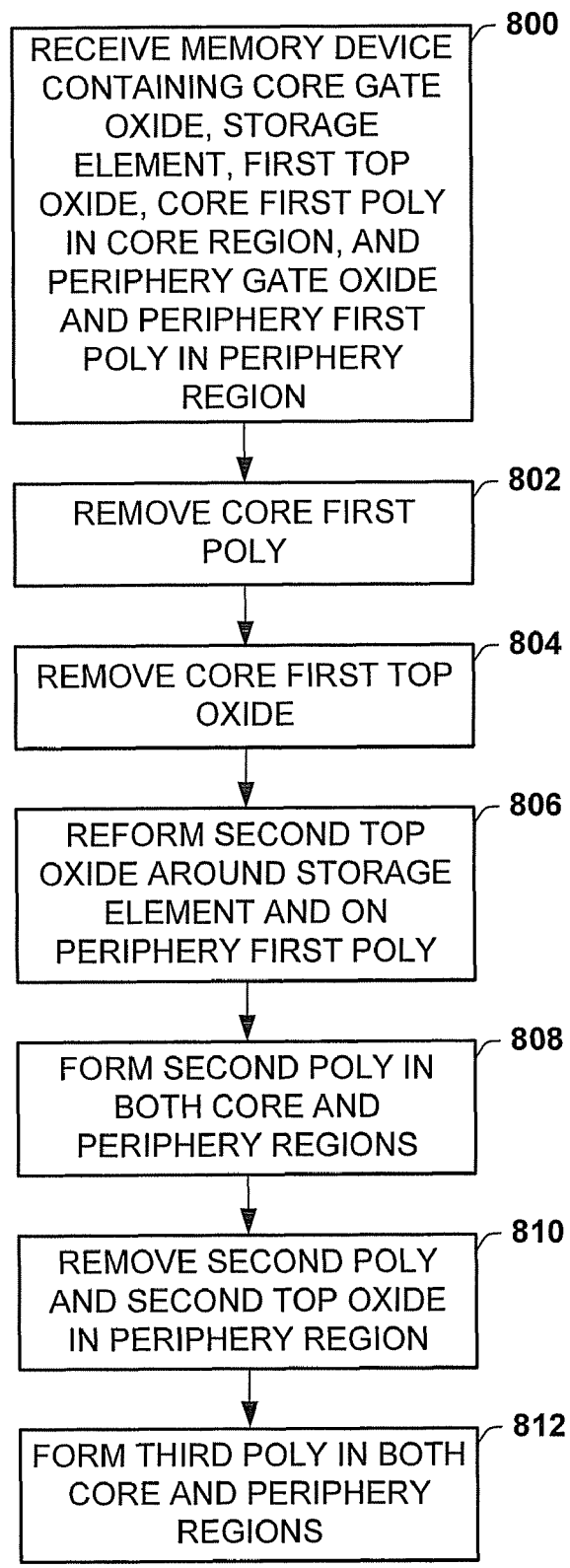
FIG. 8 illustrates an exemplary methodology for replacing/reforming a top oxide of a memory device in accordance with an aspect of the subject invention.

FIG. 8 illustrates an exemplary methodology of replacing/reforming a top oxide around a storage element of a memory device or improving quality of a top oxide around a storage element of a memory device. At 800, a memory device is provided. The memory device contains a core region and periphery region. In the core region, the memory device may contain a core gate oxide on a semiconductor substrate, a storage element on the core gate oxide, a first top oxide around the storage element, and a core first poly on the first top oxide. In the periphery region, the memory device may contain a periphery gate oxide on the semiconductor substrate and the periphery first poly on the periphery gate oxide. The memory device may further contain a dielectric on the semiconductor substrate to separate the storage elements.

At 802, the core first poly in the core region is removed by, for example, etching. At 804, the core first top oxide in the core region is removed by, for example, etching. At 806, a second top oxide is formed around the storage element in the core region and on the first poly in the periphery region. At 808, a second poly is formed over the semiconductor substrate in both the core and periphery regions. At 810, the second poly and second top oxide in the periphery region are removed by, for example, etching. At 812, a third poly is formed on the semiconductor substrate in both the core and periphery regions.

Although not shown, the methodology of FIG. 8 may include any suitable semiconductor structure fabrication processes. General examples of semiconductor structure fabrication processes include masking, patterning, etching, planarization, thermal oxidation, implant, annealing, thermal treatment, and deposition techniques normally used for making semiconductor structures.

The memory device of the subject invention can be any suitable memory devices. Examples of memory devices include volatile memories and non-volatile memories. Examples of volatile memories include RAM such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), Rambus dynamic RAM (RDRAM), and the like. Examples of non-volatile memories include ROM, PROM, electrically programmable ROM (EPROM), electrically erasable programmable ROM (EEPROM), flash memory, and the like. The memory device also can be employed for central processing units (CPUs), input/output devices (I/O chips), and the like.

The resultant memory device formed herein is useful in any electronic device. For example, the resultant memory device is useful in computers, appliances, industrial equipment, hand-held devices, telecommunications equipment, medical equipment, research and development equipment, transportation vehicles, radar/satellite devices, and the like. Hand-held devices, and particularly hand-held electronic devices can achieve improvements in portability due to the quality, small size, lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "contain," "includes," and "involves" are used in either the detailed description or the claims, such terms are intended to be inclusive in a manner similar to the term "comprising" as "comprising" is interpreted when employed as a transitional word in a claim.

What is claimed is:

1. A method of replacing a core top oxide of a memory device comprising a core region and a periphery region on a semiconductor substrate, the core region comprising a core gate oxide, a storage element, a core first top oxide, and a core first poly, the periphery region comprising a periphery gate oxide and a periphery first poly, the method comprising:
    forming a first mask on the periphery first poly;
    removing the core first poly and the core first top oxide in the core region;
    forming a core second top oxide around the storage element in the core region;
    forming a second poly on the core second top oxide in the core region; and
    forming a third poly on the second poly in the core region and on the periphery first poly in the periphery region, wherein the upper surface of the third poly in the core region is substantially coplanar with the upper surface of the third poly in the periphery region,
    wherein the periphery first poly is not substantially damaged or removed by removing the core first poly and the core first top oxide and by forming the core second top oxide,
    the memory device further comprises a dielectric on the semiconductor substrate in the core region, and the upper surface of the third poly on the dielectric in the core region is substantially coplanar with the upper surface of the third poly in the periphery region, and
    a sum of heights of the dielectric, the second poly, and the third poly in the core region is substantially equal to a sum of heights of the first poly and the third poly in the periphery region.

2. The method of claim 1, wherein the first poly has a thickness from about 500 to 3,000 Angstroms.

3. The method of claim 1, wherein removing the core first poly comprises plasma etching.

4. The method of claim 1, wherein removing the core first top oxide comprises etching the core top oxide using a halogen acid.

5. The method of claim 1, wherein forming the second top oxide comprises a slot plane antenna process.

6. The method of claim 1, wherein the upper surface of the third poly on the storage element in the core region is substantially coplanar with the upper surface of the third poly in the periphery region.

7. The method of claim 1, wherein the dielectric comprises silicon dioxide.

8. The method of claim 1, wherein the dielectric comprises a low K material.

9. A method of improving quality of a core top oxide of a memory device comprising a core region and a periphery region on a semiconductor substrate, the core region comprising a core gate oxide, a storage element, a core first top oxide, and a core first poly, the periphery region comprising a periphery gate oxide and a periphery first poly, the method comprising:
    removing the core first poly and the core first top oxide while not removing the periphery first poly;
    forming a core second top oxide around the storage element in the core region and on the periphery first poly in the periphery region;
    forming a second poly over the semiconductor substrate in both the core and periphery regions;
    removing the second poly in the periphery region;
    removing the second top oxide in the periphery region; and
    forming a third poly on the semiconductor substrate in both the core and periphery regions, wherein
    the memory device further comprises a dielectric on the semiconductor substrate in the core region, and the upper surface of the third poly on the dielectric in the core region is substantially coplanar with the upper surface of the third poly in the periphery region, and
    a sum of heights of the dielectric, the second poly, and the third poly in the core region is substantially equal to a sum of heights of the first poly and the third poly in the periphery region.

10. The method of claim 9, wherein removing the core first poly comprises plasma etching.

11. The method of claim 9, wherein removing the core first top oxide comprises etching the core top oxide using a halogen acid.

12. The method of claim 9, wherein forming the second top oxide comprises a slot plane antenna process.

13. The method of claim 9, wherein an upper surface of the third poly on the storage element in the core region is substantially coplanar with an upper surface of the third poly in the periphery region.

14. A method of replacing a core top oxide of a memory device comprising a core region and a periphery region on a semiconductor substrate, the core region comprising a core gate oxide, a storage element, a core first top oxide, a dielectric, and a core first poly, the periphery region comprising a periphery gate oxide and a periphery first poly, the method comprising:

forming a first mask on the periphery first poly;

removing the core first poly and the core first top oxide;

forming a second top oxide around the storage element in the core region, wherein forming the second top oxide around the storage element comprises forming the second top oxide on the periphery first poly in the periphery region;

forming a second poly over the semiconductor substrate in both the core and periphery regions;

removing the second poly and the second top oxide in the periphery region while not removing the second poly and the second top oxide in the core region; and forming a third poly on the semiconductor substrate in both the core and periphery regions, wherein the periphery first poly is not substantially damaged or removed by removing the core first poly and the core first top oxide and by forming the core second top oxide, and a sum of heights of the dielectric, the second poly, and the third poly in the core region is substantially equal to a sum of heights of the first poly and the third poly in the periphery region.

15. The method of claim 14, wherein the dielectric comprises a low K material.

16. The method of claim 14, wherein forming a second top oxide comprises a slot plane antenna process.

17. The method of claim 14, wherein not removing the second poly and the second top oxide in the core region comprises protecting the periphery first poly by a first mask.

18. The method of claim 14, wherein the dielectric comprises silicon dioxide.

19. The method of claim 14, wherein an upper surface of the third poly on the dielectric in the core region is substantially coplanar with an upper surface of the third poly in the periphery region.

20. The method of claim 14, wherein an upper surface of the third poly on the storage element in the core region is substantially coplanar with an upper surface of the third poly in the periphery region.

* * * * *